United States Patent
Nakashima et al.

(10) Patent No.: US 7,124,418 B2
(45) Date of Patent: Oct. 17, 2006

(54) METHOD FOR TREATING CIRCUIT BOARD FOR USE IN DISK RECORDER OR PLAYER APPARATUS

(75) Inventors: Hiroshi Nakashima, Hirakata (JP); Haruhiko Yoneda, Minoo (JP)

(73) Assignee: Sanyo Electric Co., Ltd., Moriguchi (JP)

(*) Notice: Subject to any disclaimer, the term of this patent is extended or adjusted under 35 U.S.C. 154(b) by 479 days.

(21) Appl. No.: 10/477,197

(22) PCT Filed: May 23, 2002

(86) PCT No.: PCT/JP02/05026

§ 371 (c)(1),
(2), (4) Date: Nov. 17, 2003

(65) Prior Publication Data

US 2004/0174626 A1    Sep. 9, 2004

(30) Foreign Application Priority Data

May 24, 2001    (JP) .............................. 2001-154836

(51) Int. Cl.
*G11B 33/14* (2006.01)

(52) U.S. Cl. ..................................................... 720/648
(58) Field of Classification Search .................... 360/1; 720/648

See application file for complete search history.

(56) References Cited

U.S. PATENT DOCUMENTS

| | | | | |
|---|---|---|---|---|
| 4,115,185 A | * | 9/1978 | Carlson et al. | 430/318 |
| 5,075,807 A | | 12/1991 | Inoue et al. | |
| 2001/0040298 A1 | * | 11/2001 | Baba et al. | 257/778 |

FOREIGN PATENT DOCUMENTS

| | | |
|---|---|---|
| JP | 5-182443 | 7/1993 |
| JP | 7-176855 | 7/1995 |

* cited by examiner

*Primary Examiner*—Allen Cao
(74) *Attorney, Agent, or Firm*—Armstrong, Kratz, Quintos, Hanson & Brooks, LLP

(57) ABSTRACT

A circuit board is mounted in a cabinet in which a disk is housed. A treatment for preliminarily releasing ammonia possibly causing fogging of the disk from the circuit board is performed by allowing the circuit board to stand at 70° C. outside the cabinet for 24 hours before the circuit board is mounted in the cabinet.

3 Claims, 1 Drawing Sheet

METHOD FOR TREATING CIRCUIT BOARD FOR USE IN DISK RECORDER OR PLAYER APPARATUS

TECHNICAL FIELD

The present invention relates to a method for treating a circuit board for use in a disk recorder or player apparatus.

BACKGROUND ART

FIG. 2 is a sectional view of a conventional disk recorder or player apparatus. A disk 60, which is a magneto-optical disk, is rotatably housed in a cartridge 6 having openings formed in upper and lower faces thereof. A turn table 70 and a pickup 7 movable toward and away from the turn table 70 are provided on a chassis 1 which receives the cartridge 6. A recording head 72 is attached to the pickup 7 via a head lever 71. A portion of the disk 60 is irradiated with a beam from the pickup 7 thereby to be heated at a Curie temperature and, at the same time, an upper surface portion of the disk 60 is magnetized by the recording head 72 for recording a signal therein. In signal reproduction, the disk is irradiated with a beam from the pickup 7, and the level (0-level or 1-level) of a recorded signal is determined on the basis of the diffractive direction of a light beam reflected on the disk.

The chassis 1 and the cartridge 6 are housed in a cabinet 2 constituted by cabinet halves 20, 21 which are vertically combined together. A circuit board 3 for energization of the pickup 7 and the turn table 70 is provided in the lower cabinet half 21. The circuit board 3 is composed of a glass epoxy resin or the like. It is noted that the position of the circuit board 3 is not limited to that shown in FIG. 2.

Since circuit components (not shown) mounted on the circuit board 3 generate heat during the signal recording and reproduction, the internal temperature of the cabinet 2 is liable to rise. In view of the rise of the internal temperature of the apparatus, the applicant of the present invention intends to guarantee that the apparatus normally operates at a temperature up to 70° C., and checks the apparatus to confirm that the apparatus does not malfunction at a temperature of 70° C. or lower when the apparatus is mass-produced.

The applicant found that the apparatus suffered from the following problem.

The applicant found that, when the apparatus was left at a high temperature, the surface of the disk 60 was fogged so that the C/N ratio of the reproduced signal was reduced or the disk 60 was not accurately magnetized in the recording. The applicant analyzed a substance deposited on the surface of the disk 60, and found that the major component of the substance was ammonium sulfate $(NH_4)_2SO_4$. However, none of the components provided in the apparatus were produced by employing ammonium sulfate, and there was no evidence that ammonium sulfate externally adhered onto the disk.

The applicant investigated the mechanism of the generation of ammonium sulfate and, as a result, found that ammonium sulfate was generated by the following chemical reactions.

As described above, the circuit board 3 is composed of the glass epoxy resin. Further, cases of the mounted circuit components are often composed of an epoxy resin. As well known, the epoxy resin is synthesized from bisphenol-A having a molecular formula $(CH_3)_2C(C_6H_4OH)_2$ and epichlorohydrin $C_3H_5OCl$.

Therefore, if the epoxy resin is left at a high temperature for a long period of time, bisphenol-A is decomposed and modified to undergo condensation polymerization, so that some of functional groups are removed from bisphenol-A. As a result, water and ammonia are generated as by-products. Ammonia $NH_3$ is present in the form of molecules in a trace amount, but reacts with sulfur dioxide gas present in the atmosphere to provide ammonium sulfate $(NH_4)_2SO_4$ as follows:

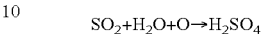

$$SO_2+H_2O+O \rightarrow H_2SO_4$$

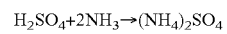

$$H_2SO_4+2NH_3 \rightarrow (NH_4)_2SO_4$$

That is, the applicant found that, where the circuit board 3 was left at around the operation guarantee temperature (70° C.) for a long period of time, ammonia is generated and, as a result, the disk 60 was fogged. With a recent trend toward the size reduction and thickness reduction of the apparatus, the cabinet 2 has a higher internal temperature. Therefore, an ammonia concentration in the cabinet 2 tends to be increased, making the disk more liable to be fogged.

It is an object of the present invention to prevent the fogging of the disk even if the disk is left at a high temperature in the apparatus for a long period of time.

DISCLOSURE OF THE INVENTION

A treatment for preliminarily releasing a substance possibly causing fogging of a disk 60 from a circuit board 3 is performed by allowing the circuit board 3 to stand in a predetermined high temperature environment outside a cabinet 2 for a predetermined period of time before the circuit board 3 is mounted in the cabinet 2.

The circuit board 3 is allowed to stand in the predetermined high temperature environment for the predetermined period of time before the circuit board 3 is mounted in the cabinet 2. Thus, the substance possibly causing the fogging of the disk 60 is released outside the cabinet 2. This prevents the fogging of the disk, thereby diminishing the possibility of causing a trouble in signal recording and reproduction.

BEST MODE FOR CARRYING OUT THE INVENTION

One embodiment of the present invention will hereinafter be described with reference to the attached drawings.

Figure 2:
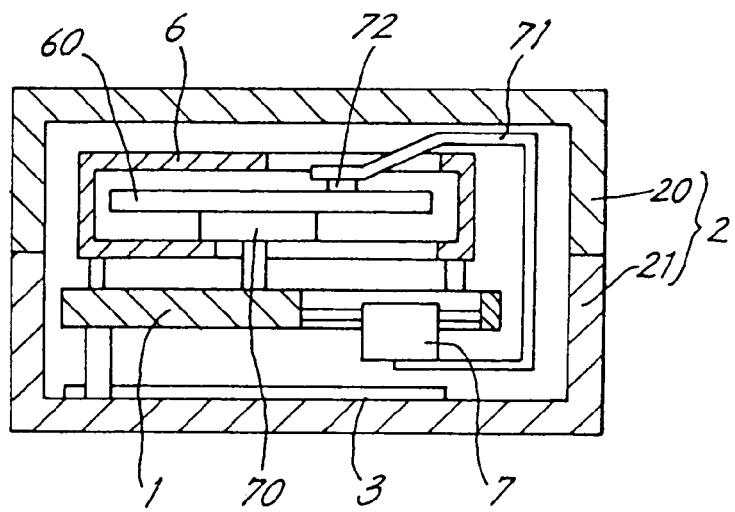
FIG. 2 is a sectional view of a conventional disk recorder/player apparatus.

A disk recorder or player apparatus has the same construction as the apparatus shown in FIG. 2. This embodiment is characterized in that the circuit board 3 is heat-treated before it is mounted in the cabinet 2.

Figure 1:
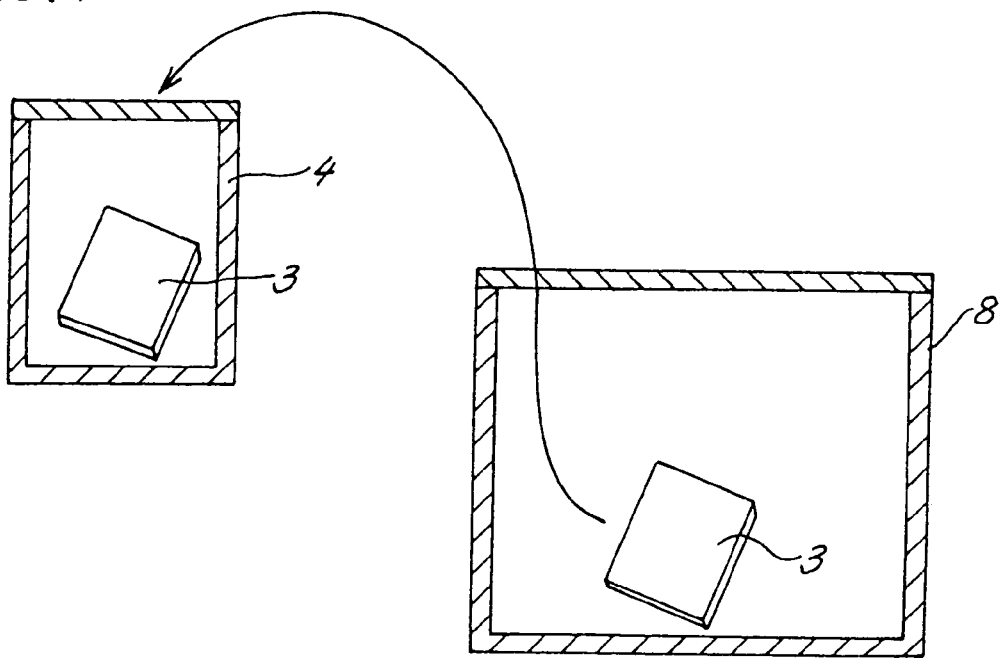
FIG. 1 is a sectional view of a chamber and a container.

The applicant heat-treated the circuit board 3 for a predetermined period of time to determine the amount of ammonia released from the circuit board 3 when the apparatus was kept at a high temperature. First, all circuit boards 3 to be mounted in the apparatus were put in a container 4 as shown in FIG. 1, and the container 4 was sealed. The container 4 was allowed to stand at 80° C. for one hour. Then, the container 4 was opened, and the ammonia concentration of air in the container was measured by means of a detection tube. At this time, the ammonia concentration was 2 PPM. That is, 2 PPM of ammonia was released in one hour.

Figure 3:
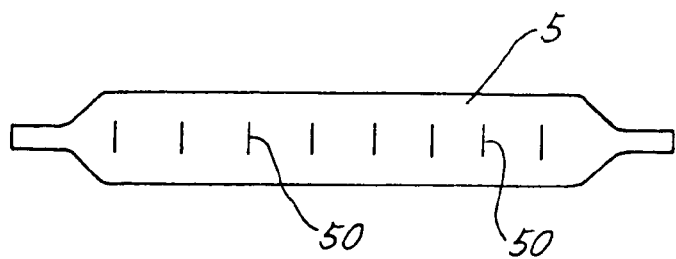
FIG. 3 is a front view of a detection tube.

Here, the detection tube is a tube 5 filled with a detection agent and having a scale 50 provided on the surface of the tube 5 as shown in FIG. 3. When the air to be subjected to the measurement is introduced into the tube 5, the detection agent reacts with ammonia and is partly changed in color. Then, the length of a portion of the detection agent changed in color is measured by the scale 50. Thus, the concentration can easily be determined.

Since ammonia is rarely present in the atmosphere, a concentration of 2 PPM is very high. Therefore, the ammonia concentration in the cabinet 2 is increased if the apparatus is kept at the high temperature.

Experiment 1

In view of this data, the applicant came up with an idea that it would be possible to preliminarily remove ammonia by allowing the circuit board 3 to stand at a high temperature for a predetermined period of time before mounting the circuit board 3 in the cabinet 2. The applicant considered that it would be desirable to set the temperature condition as high as possible. The upper limit of the operation guarantee temperature of the circuit components mounted on the circuit board 3 is 70° C. If the circuit board 3 is left at a temperature higher than 70° C. for a long period of time, there is a possibility that the mounted circuit components malfunction. Therefore, the temperature at which the circuit board is allowed to stand for a long period of time was set at 70° C.

The applicant allowed three circuit boards 3 to stand in a large volume chamber 8 kept at an internal temperature of 70° C. for 12 hours, for 24 hours and for 48 hours, respectively. Thereafter, the circuit boards 3 were each allowed to stand in the container 4 kept at an internal temperature of 80° C. for one hour, and an ammonia concentration in the container 4 was measured. Of course, the chamber 8 and the container 4 were located outside the cabinet 2. Data obtained by the measurement of the ammonia concentration is shown in Table 1.

TABLE 1

| Period (at 70° C.) | Ammonia concentration in chamber 4 |
|---|---|
| 12 hours | 0.3 to 0.4 PPM |
| 24 hours | 0.2 PPM |
| 48 hours | 0.15 to 0.2 PPM |

As indicated by the above data, the concentration of ammonia released in the container 4 after the circuit boards were left in the chamber 8 at 70° C. for 24 hours or for 48 hours was about 0.2 PPM. Therefore, the ammonia concentration was reduced to about ¹/₁₀ as compared with a case where the circuit boards were not allowed to stand in the chamber 8. The errorless measurement limit of the detection tube is about 0.1 PPM, so that the ammonia concentrations after the circuit boards were left for 24 hours and for 48 hours are regarded to be virtually equivalent to each other. Therefore, the applicant expected that sufficiently effective measures against the fogging of the disk 60 would be provided by mounting the circuit board 3 in the cabinet 2 after allowing the circuit board 3 to stand at 70° C. for 24 hours. The concentration of ammonia released in the chamber 8 was not measured, but supposedly about 1.8 PPM (=2−0.2).

Experiment 2

The applicant allowed three circuit boards 3 to stand in the chamber 8 for 12 hours, for 24 hours and for 48 hours, respectively, in substantially the same manner as described above, except that the internal temperature of the chamber 8 was changed to 60° C. Thereafter, the circuit boards 3 were allowed to stand in the container 4 kept at an internal temperature of FIG. 2 is a sectional view of a conventional disk recorder/player apparatus; and 80° C. for one hour, and an ammonia concentration in the container 4 was measured. Data obtained by the measurement is shown in Table 2.

TABLE 2

| Period (at 60° C.) | Ammonia concentration in chamber 4 |
|---|---|
| 12 hours | 0.5 PPM |
| 24 hours | 0.2 to 0.3 PPM |
| 48 hours | 0.2 to 0.3 PPM |

As indicated by the above data, the concentrations of ammonia released in the container 4 after the circuit boards were left in the chamber 8 for 24 hours and for 48 hours were virtually equivalent to each other and about 0.2 PPM. It is considered that the adverse effect of heat on the mounted circuit components is suppressed in the case where the circuit boards are left at 60° C., as compared with the case where the circuit boards are left at 70° C. The applicant used a circuit board 3 treated by allowing the circuit board 3 to stand in the chamber 8 at 60° C. for 24 hours and then in the container 4 kept at 80° C. for one hour.

The circuit board 3 was mounted in the cabinet 2 after being subjected to the heat treatment according to the embodiment, whereby ammonia released from the circuit board 3 in the cabinet 2 was drastically reduced. The applicant observed the disk 60, and found that no ammonium sulfate adhered on the disk 60 or the amount of ammonium sulfate adhering on the disk 60 was drastically reduced. Thus, the signal recording or reproduction on the disk 60 can be stabilized.

What is claimed is:

1. A method for treating a circuit board to be mounted in a cabinet of a disk recorder or player apparatus in which a disk is housed, for releasing from the circuit board a substance possibly causing fogging of the disk by a chemical reaction at a high temperature, the method comprising the step of allowing the circuit board to stand in a predetermined high temperature environment outside the cabinet for a predetermined period of time before the circuit board is mounted in the cabinet to preliminarily release the substance possibly causing the fogging of the disk from the circuit board.

2. A method as set forth in claim 1, wherein the substance possibly causing the fogging of the disk is ammonia.

3. A method as set forth in claim 1, wherein the predetermined high temperature environment in which the circuit board is allowed to stand before the circuit board is mounted in the cabinet is kept at a temperature which is not higher than an operation guarantee temperature of the disk recorder or player apparatus.

* * * * *